(12) United States Patent
Wu et al.

(10) Patent No.: US 7,385,283 B2
(45) Date of Patent: Jun. 10, 2008

(54) THREE DIMENSIONAL INTEGRATED CIRCUIT AND METHOD OF MAKING THE SAME

(75) Inventors: Weng-Jin Wu, Hsinchu (TW); Wen-Chih Chiou, Miaoli (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/426,734

(22) Filed: Jun. 27, 2006

(65) Prior Publication Data

US 2007/0296073 A1    Dec. 27, 2007

(51) Int. Cl.
*H01L 23/02* (2006.01)
*H01L 21/00* (2006.01)

(52) U.S. Cl. .............................. 257/686; 257/E23.085; 257/E23.114; 257/E25.027; 257/E23.063; 257/E25.023; 257/E23.011; 257/E25.013; 257/E21.597; 257/777; 257/723; 257/724; 257/725; 257/728; 257/668; 257/701; 257/698; 257/691; 257/685; 257/774; 257/773; 438/109

(58) Field of Classification Search ................ 257/686, 257/E23.085, 685, 668, 691, 692, 693, 696, 257/698, 774, 773, 700, 701, 723, 724, 725, 257/728, 777, E23.114, E25.027, E23.063, 257/E25.023, E23.011, E25.013, E21.597; 438/109, 118, 459
See application file for complete search history.

(56) References Cited

U.S. PATENT DOCUMENTS

| | | |
|---|---|---|
| 3,343,256 A | 9/1967 | Smith et al. |
| 3,372,070 A | 3/1968 | Zuk |
| 3,648,131 A | 3/1972 | Stuby |
| 3,787,252 A | 1/1974 | Filippazzi et al. |
| 5,111,278 A | 5/1992 | Eichelberger |
| 5,528,080 A | 6/1996 | Goldstein |
| 5,618,752 A | 4/1997 | Gaul |
| 5,646,067 A | 7/1997 | Gaul |
| 5,682,062 A | 10/1997 | Gaul |
| 5,814,889 A | 9/1998 | Gaul |
| 5,973,396 A | 10/1999 | Farnworth |
| 6,355,976 B1 | 3/2002 | Faris |
| 6,459,150 B1 | 10/2002 | Wu et al. |
| 6,469,374 B1 * | 10/2002 | Imoto .......................... 257/686 |
| 6,489,676 B2 * | 12/2002 | Taniguchi et al. .......... 257/698 |
| 6,548,891 B2 * | 4/2003 | Mashino ..................... 257/700 |
| 6,614,095 B1 | 9/2003 | Adamschik et al. |
| 6,642,081 B1 | 11/2003 | Patti |
| 6,897,125 B2 | 5/2005 | Morrow et al. |
| 6,982,487 B2 | 1/2006 | Kim et al. |
| 7,157,787 B2 | 1/2007 | Kim et al. |

(Continued)

OTHER PUBLICATIONS

Daniel Radack, "3D Microsystems", DARPA Microsystems Technology Office, 32 pages.

(Continued)

*Primary Examiner*—Alexander O Williams
(74) *Attorney, Agent, or Firm*—Duane Morris LLP

(57) ABSTRACT

A three dimensional integrated circuit structure includes at least first and second devices, each device comprising a substrate and a device layer formed over the substrate, the first and second devices being bonded together in a stack, wherein the bond between the first and second devices comprises a metal-to-metal bond and a non-metal-to-non-metal bond.

22 Claims, 15 Drawing Sheets

U.S. PATENT DOCUMENTS

| | | |
|---|---|---|
| 7,179,740 B1 | 2/2007 | Hsuan |
| 2004/0214387 A1 | 10/2004 | Madurawe |
| 2005/0127478 A1 | 6/2005 | Hiatt et al. |
| 2005/0215054 A1 | 9/2005 | Rasmussen et al. |
| 2007/0045780 A1 | 3/2007 | Akram et al. |

OTHER PUBLICATIONS

Subhash Gupta et al., "Techniques for Producing 3D ICs with High-Density Interconnect", 5 pages.

J.-Q. Lu et al., "Evaluation Procedures for Wafer Bonding and Thinning of Interconnect Test Structures for 3D ICs", 3 page.

A. Fan et al., "Copper Wafer Bonding", pp. 534-536.

K. W. Guarini et al., Electrical Integrity of State-of-the-Art 0.13 um SOI CMOS Devices and Circuits Transferred for Three-Dimensional (3D) Integrated Circuit (IC) Fabrication, 2002 IEEE, pp. IEDM 943-945.

Shamik Das et al., Calibration of Rent's-Rule Models for Three-Dimensional Integrated Circuits, IEEE Transactions On Very Large Scale Integration (VLSI) Systems, vol. 12. No. 4. Apr. 2004. pp. 359-366.

Shamik Das et al., "Technology, Performance, and Computer-Aided Design of Three-Dimensional Integrated Circuits", ISPD '04 Apr. 18-21, 2004, 8 pages.

Shinya Ito et al., "Mechanical Stress Effect of Etch-Stop Nitride and its Impact on Deep Submicron Transistor Design", 2000 IEEE, pp. IEDM 00-247-IEDM 250.

* cited by examiner

THREE DIMENSIONAL INTEGRATED CIRCUIT AND METHOD OF MAKING THE SAME

FIELD OF THE INVENTION

The present invention relates generally to integrated circuits, and more specifically to three dimensional (3D) integrated circuits. The invention also relates to interconnect and bonding structures and methods of forming interconnects and bonding structures.

BACKGROUND OF THE INVENTION

As feature sizes of integrated circuits continue to shrink to meet performance demands and overall chip dimensions increase, the interconnect structure consumes more of the available power and delay budgets for integrated circuits. As wiring has become more expensive and clock frequencies have increased, designers have investigated three-dimensional integration as a means of reducing signaling across chips.

Three dimensional integrated circuits have multiple layers of active components. The active components can be wired to devices on the same and/or different layers. In one approach, multiple conventional wafers are arranged together in a stack with some means of interconnecting the conventional circuits. Wafers can be bonded face-to-face (i.e., such that the metallizations are adjacent) or face-to-back (i.e., such that the metallization layers of one wafer face the substrate of a second wafer) using interconnects formed in high-aspect-ratio vias through the device area of the upper wafer. Following bonding of the wafers, the stack is packaged.

Presently, there are three bonding schemes for bonding wafers in the three dimensional stack: (i) copper-to-copper bonding, (ii) adhesive bonding and (iii) fusion bonding. In the direct copper bonding scheme, exposed copper pads are bonded together using a high load pressure high temperature, long duration anneal process. For advanced devices with low dielectric constant (low k) materials, this process may induce failure of the low k materials. Adhesive bonding typically employs BCB (BenzoCycloButene), which has a glass transition temperature of 350° C. The bonding material is unstable during subsequent higher temperature processes utilized in completing the device interconnections. Finally, direct oxide bonding (fusion bonding) between two wafers with oxide top layers is a low temperature bonding process. The oxide layers are pretreated with wet treatment or plasma to generate some dangling bonds for OH bonding. By using fusion bonding, deep through via processes need to be performed for vertical interconnects after the bonding process, which requires better bonding alignment accuracy than direct copper bonding.

An improved three-dimensional integration structure and method are desired.

SUMMARY OF THE INVENTION

A three dimensional integrated circuit structure is provided including at least first and second devices, each device comprising a substrate and a device layer formed over the substrate, the first and second devices being bonded together in a stack, wherein the bond between the first and second devices comprises a metal-to-metal bond and a non-metal-to-non-metal bond.

A method of forming a three dimensional integrated circuit is also provided. At least first and second devices are provided, each device comprising a substrate and a device layer formed over said substrate. The first and second devices are bonded together in a stack, wherein the bond between the first and second devices comprises a metal-to-metal bond and a non-metal-to-non-metal bond.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

As sometimes used herein, three-dimensional integration refers to any process by which multiple conventional device layers may be stacked and electrically interconnected. Three dimensional integration provides benefits in terms of wire length, area, timing and energy consumption.

FIGS. 1-3 illustrate various embodiments of methods of forming three-dimensional integrated circuits and three-dimensional integrated circuits formed thereby.

Figure 1A:
FIGS. 1A-1H illustrate a first method of forming a three-dimensional integrated circuit.
Figure 1B:
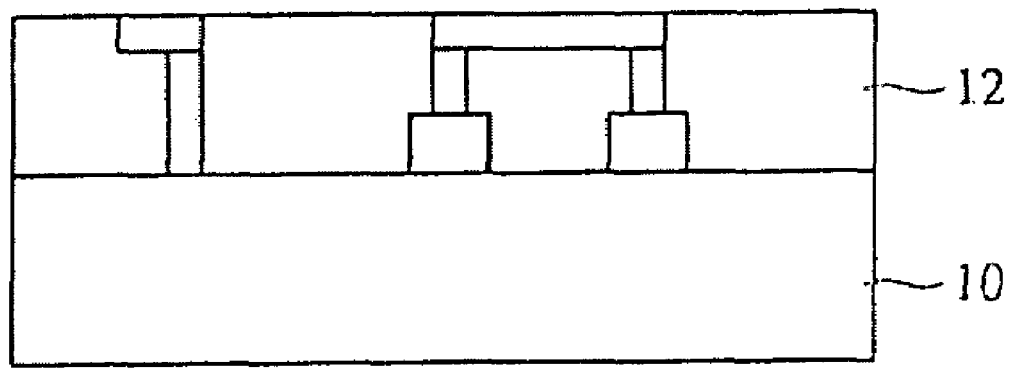

As shown in FIG. 1A, a substrate 10 is provided. Substrate 10 preferably comprises a silicon substrate although other semiconductor substrates, such as silicon-germanium substrate, III-V compound substrate, or silicon on insulator (SOI) substrate may be utilized in embodiments. At FIG. 1B, the silicon substrate 10 is processed to form a device layer 12. As those in the art will understand, the device layer 12 includes one or more transistors, such as MOS transistors, capacitors or other devices formed over and/or in an active region. For purposes of this discussion, the device layer can also be considered to include metal interconnects, typically formed from tungsten (W), inter level dielectric (ILD) layers and one or more metallization layers, such as M1-M9 (not shown), which can comprise aluminum, copper, AlCu or other conductive material. The details of the formation of devices are well known in the art of semiconductor device manufacturing and are not repeated herein. The device layer functionally can be, for example, a memory layer, a power device, an ASIC (application specific integrated circuit), processor or other functional device.

Figure 1C:
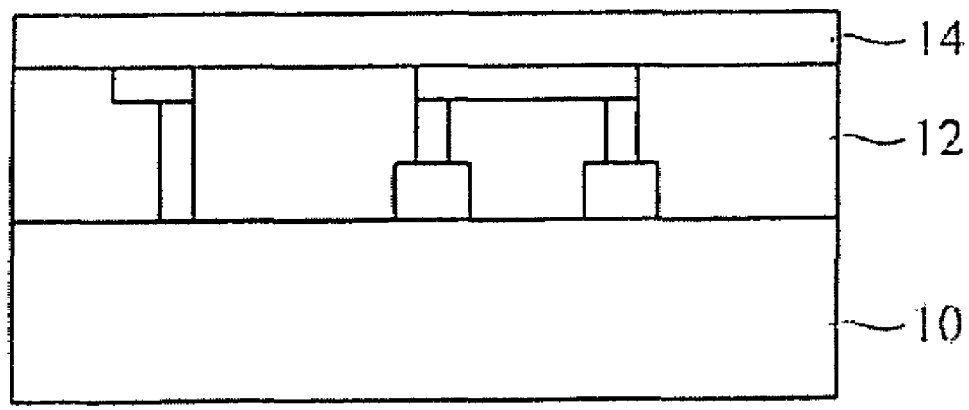

At FIG. 1C, a dielectric layer 14 is deposited over the device layer 12. In one embodiment, the dielectric layer comprises silicon, silicon nitride ($SiN_x$) silicon oxide ($SiO_x$) such as $SiO_2$, silicon oxynitride (SiOxNy), or silicon carbide (SiC).

Figure 1D:
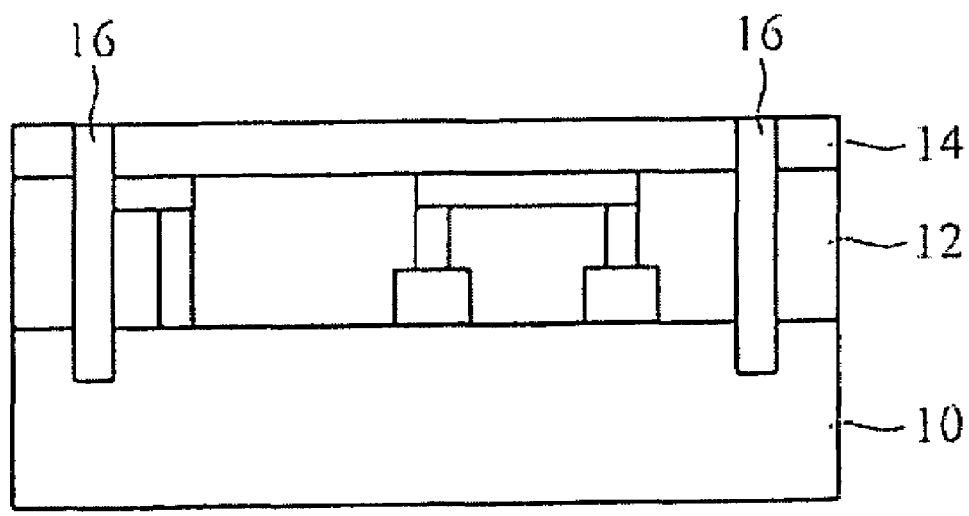

At FIG. 1D, metal plugs or interconnects 16 are formed. These metal interconnects may be formed from W, and more preferably from copper (Cu), including AlCu (collectively, Cu). In one embodiment, the interconnects 16 are formed using the damascene process, which should be familiar to those in the art. First, vias are etched through the dielectric layer 14, through device layer 12 and into substrate 10. This process can be performed by plasma etch process, such as an Inductively Coupled Plasma (ICP) etch. A dielectric liner (not shown) then may be deposited on the via sidewalls. In embodiments, the liner materials may comprise silicon oxide (SiOx) or silicon nitride (SiNx), which may be formed by plasma deposition process, such as physical vapor deposition (PVD) or chemical vapor deposition (CVD) including plasma enhanced chemical vapor deposition (PECVD). Next, a seed layer of Cu is plated in the via. Then a layer of copper is deposited in the vias and over the dielectric layer 14, followed by planarization of the copper layer, such as by chemical mechanical polishing (CMP), down to the top surface of the dielectric layer 14. The exposed copper surface and dielectric layer surface 14 are planar or the Cu surface may protrude above the top surface of the dielectric layer 14. Cleaning processes, such as to remove copper oxides, may also be employed. As can be seen in FIG. 1D, the interconnects 16 serve as electrical interconnects to the device layer 14 and/or substrate 10. As will be explained below, the interconnects 16 also serve to bond devices together. Although two interconnects 16 are shown, any number of interconnects 16 can be provided as is electrically and mechanically dictated by the design, although at least two interconnects is preferred.

In embodiments, the diameter of the vias can be range from 0.5 µm to 25 µm, and the thickness of the thinned substrate ranges from less than about 10 µm to about 75 µm.

Figure 1E:
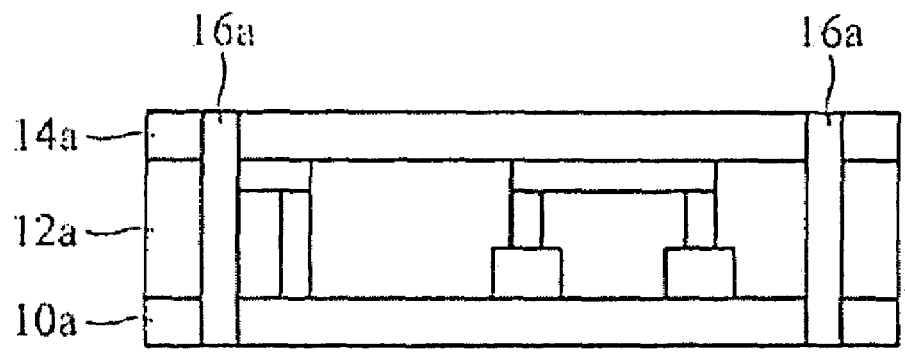

At FIG. 1E, a second device is formed in the manner described above in connection with FIGS. 1A-1D, but with modification as described hereafter. The second device includes a substrate 10a, a device layer 12a, a dielectric layer 14a and interconnects 16a. As can be seen, the substrate 10a has been thinned, such as by polishing by grinding and/or etching, to expose the interconnects 16a through the substrate 10a. In an alternative embodiment, the second device can include a second dielectric layer formed over the bottom surface of the substrate 10a, and interconnects 16a are also formed through this dielectric layer and exposed. Advantageously, the device formed at FIG. 1E is tested after formation and prior to bonding to other devices in a stack as described below, allowing identification of operable devices prior to bonding to other devices.

Although preferred, it is not necessary that the substrate 10a be thinned. Substrate 10a could have a similar thickness as substrate 10, only with the interconnects formed all the way through the substrate 10a. However, thinning the substrate 10a provides benefits in reduced processing time and costs associated with forming interconnects 16a, reduced overall device size and an improved, roughened silicon surface for bonding as described below.

Figure 1F:
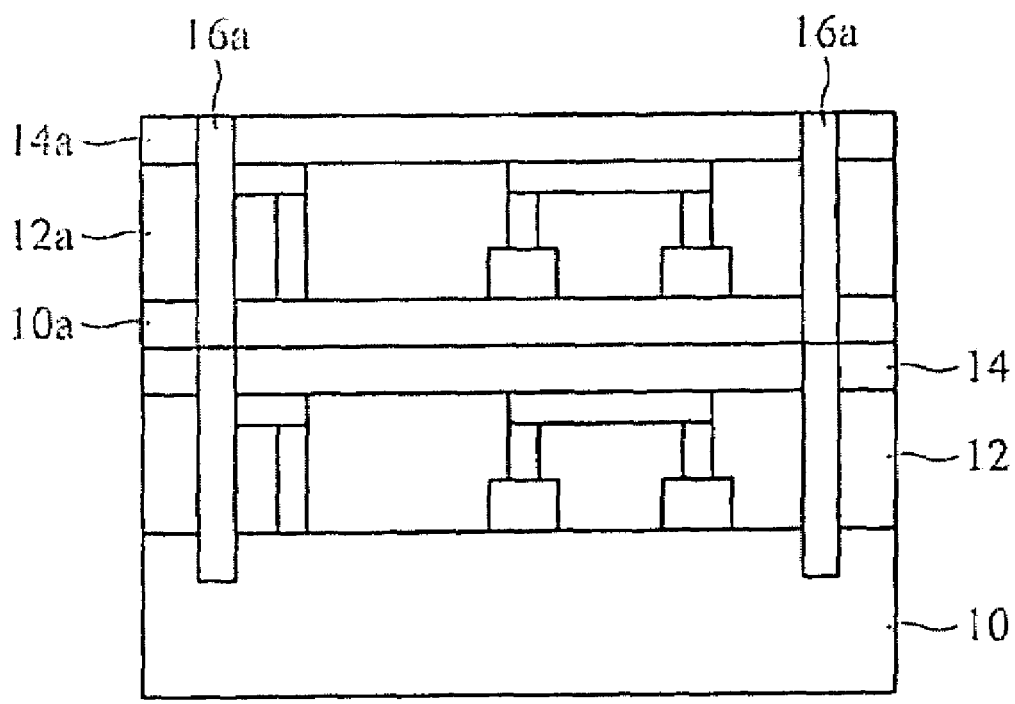

At FIG. 1F, the first and second devices, with each device including a substrate, device layer with metallization layer(s) and dielectric layer formed thereover, are aligned and bonded together. Specifically, FIG. 1F shows the devices aligned in a back-to-face alignment, where the backside (thinned substrate 10a side) of the second device faces the top surface (dielectric 14 side) of the first device. The metal interconnects 16, 16a are aligned and contacted and the dielectric layer 14 forms an interface with, and contacts to, the thinned silicon wafer 10a. The stacked structure is then annealed for a time and temperature sufficient to bond the interconnects 16a to interconnects 16 and to fuse silicon substrate 10a to the dielectric layer 14. By way of example, assuming interconnects 16, 16a are formed of copper, substrate 10 is a silicon substrate and dielectric layer 14 is silicon oxide, the stack is annealed for between about 0.5 to 10 hours at between about 250-500° C. under suitable pressure.

The device stack shown in FIG. 1F comprises a robust hybrid bond comprising at least one metal-to-metal bond (Cu—Cu) and a non-metal-to-non-metal bond at the interface between the stacked devices. In embodiments, the non-metal-to-non-metal bond can comprise combinations dielectric bonds between Si, $SiN_x$, SiOx, or a polymer. In one preferred embodiment, the non-metal-to-non-metal bond is Si to $SiO_2$. Alternatively, the non-metal-to-non-metal bond can comprise an adhesive bond using an adhesive such as BCB or polyimide applied to one or more of the devices. In one embodiment, if adhesive materials are used in this process, the adhesive can optionally take the place of the dielectric layer 14. The adhesive layer can be formed by using spin on coating or chemical vapor deposition.

Figure 1G:
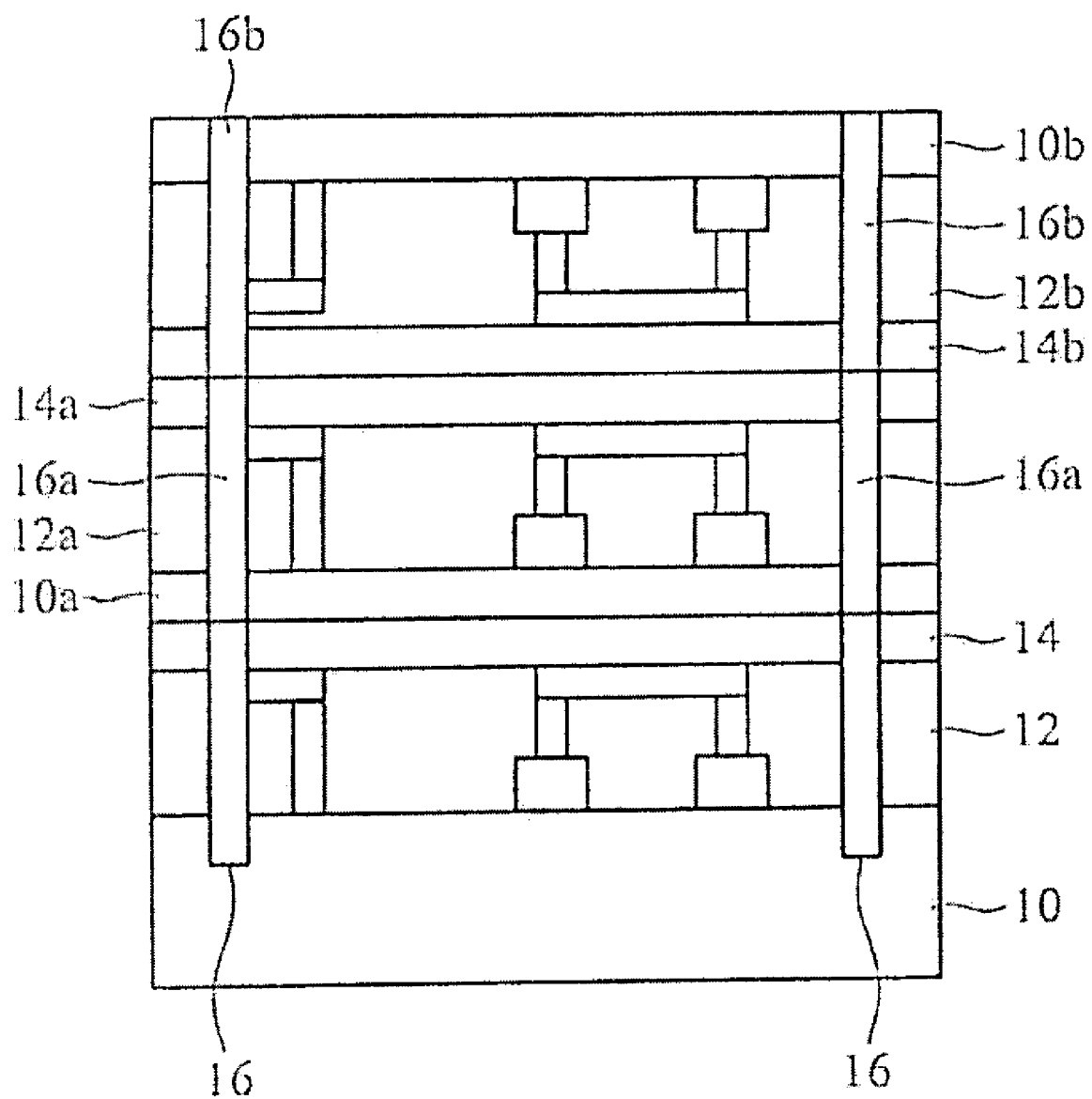
Figure 1H:
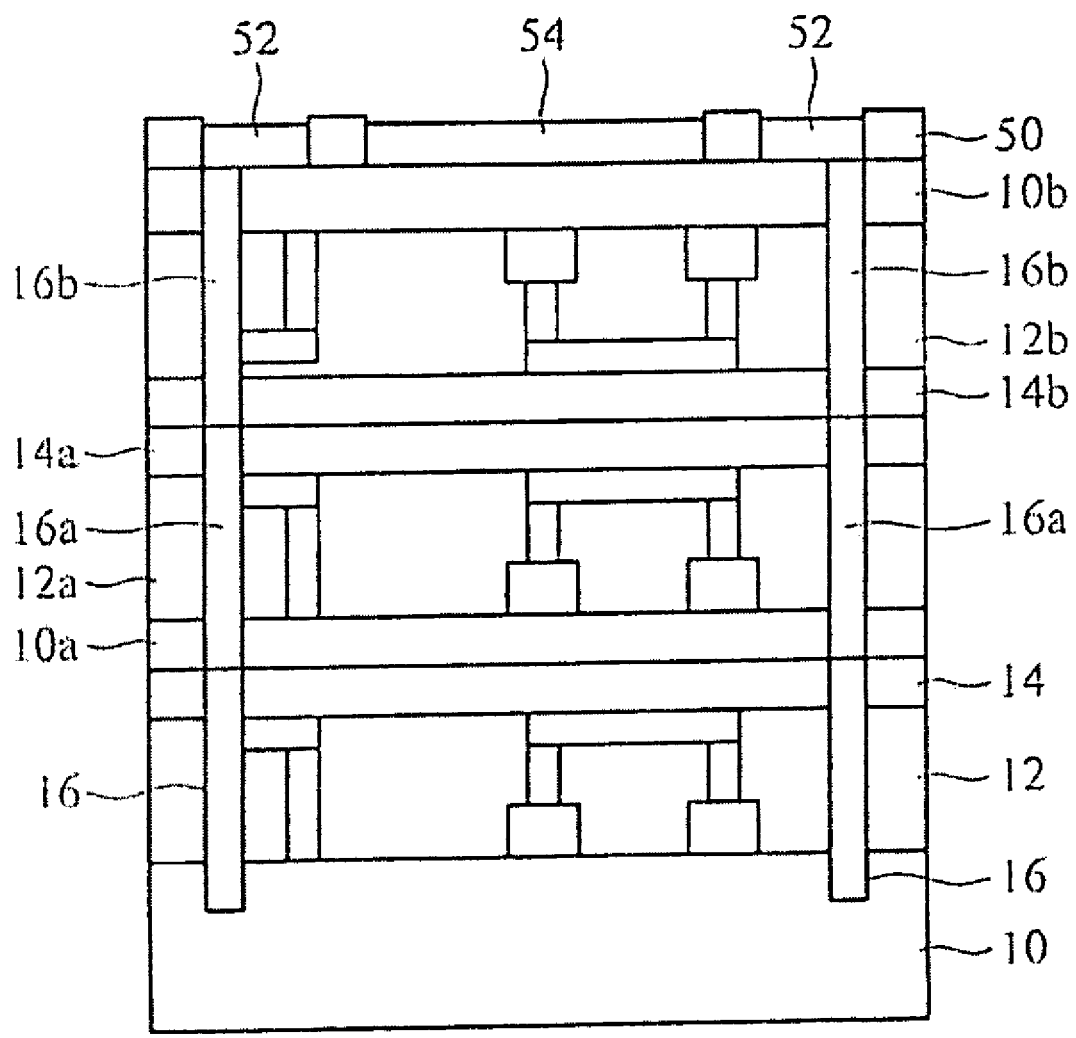

FIG. 1G shows that a third device is formed in the manner described above for the first and second devices. It should be understood that the stack can include two, three or more devices as dictated by the design and desired functionality, each device forming a hybrid bond with an adjacent device in the device stack. The third device is illustrated in FIGS. 1G and 1H for purposes of showing the top most device layer. Specifically, the third device so formed includes a thinned wafer 10b, interconnects 16b, device layer 12b and dielectric layer 14b. FIG. 1G illustrates that the topmost device of a stack formed using the present method is aligned over the other devices of the stack (i.e., interconnect to interconnect with the device immediately below), but with the back surface of substrate 16b facing upwards, i.e., with the bottom surface of the substrate 16b exposed. As described with the connection between the first two devices, the second and third devices are bonded together using a hybrid bond using both metal-to-metal and non-metal-to-non-metal bonds. These hybrid bonds between pairs of devices create a robust stack.

As shown in FIG. 1H, the final device added to the stack of FIG. 1G is disposed substrate side up to provide a robust surface for forming the bonding structure 50. The bonding structure, and steps for formation of the bonding structure, are familiar to those in the art and need not be repeated herein. Briefly, the bonding structure includes a passivation layer 54, typically comprising silicon oxide or silicon nitride, and bond pads 52, typically comprising AlCu. The bond pads 52, formed in the passivation layer 54, are aligned over the interconnects 16b, which are exposed through the substrate 10b, to make electrical connection thereto. The bond pads can be wire bond pads or flip chip bond pads. In an alternative embodiment, interconnects 16b can simply remain exposed to serve as bond pads. In this embodiment, the portion of these interconnects proximate to the passivation layer optionally could be made wider than the portion extending through the device layer 12b, such as by use of conventional damascene or dual damascene process techniques. The structure illustrated in FIG. 1H is then packaged using techniques familiar to those in the art.

The steps illustrate in FIGS. 1A-1H for the integration of the stack can be performed utilizing wafer-to-wafer bonding, individual die-to-wafer bonding, or individual die-to-individual die bonding.

An alternative method of forming a three dimensional integrated circuit device is shown in FIG. 2. The steps illustrated by FIGS. 2A-2E are essentially the same as those illustrated in FIG. 1. That is, a first device is formed having a substrate 100, a device layer 120, a dielectric layer 140 and interconnects 160. A second device is formed in the same manner having substrate 100a (which is thinned to form substrate 100a' as shown at FIG. 2E), device layer 120a, dielectric layer 140a and interconnects 160a.

Figure 2A:
FIGS. 2A-2H illustrate an alternative method of forming a three-dimensional integrated circuit.
Figure 2B:
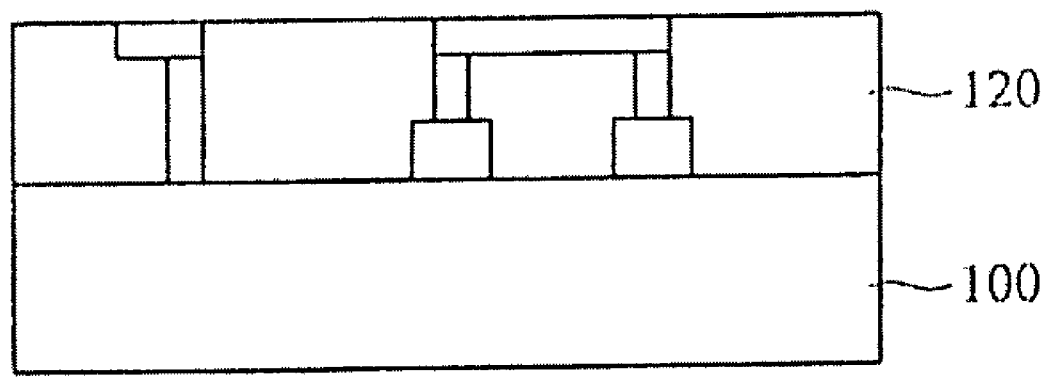
Figure 2C:
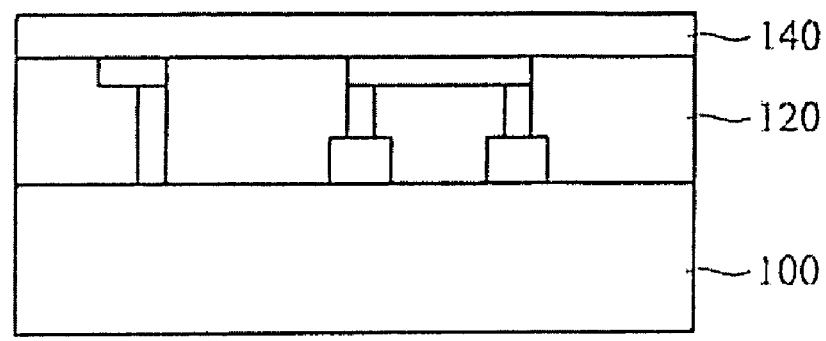
Figure 2D:
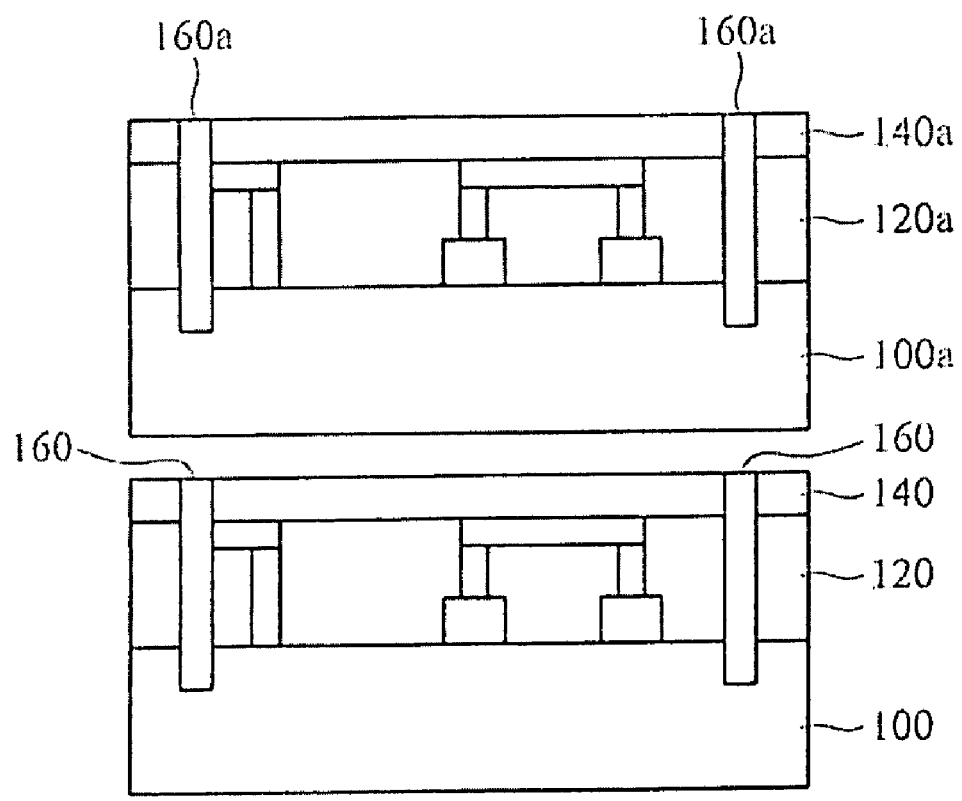
Figure 2E:
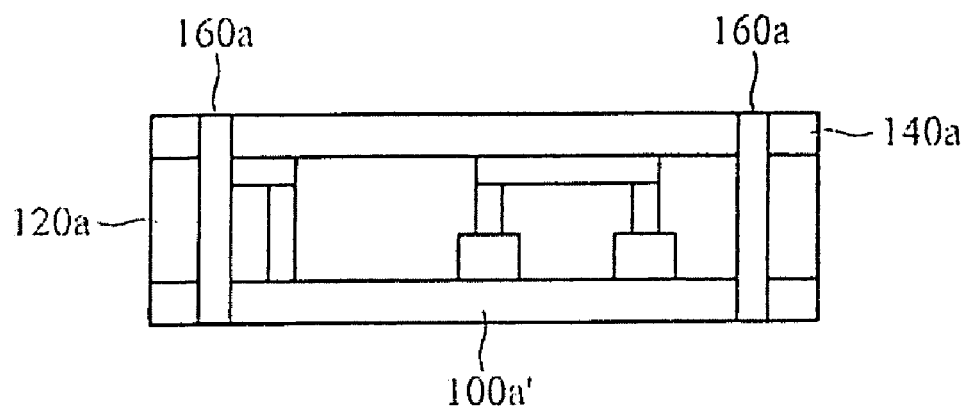
Figure 2F:
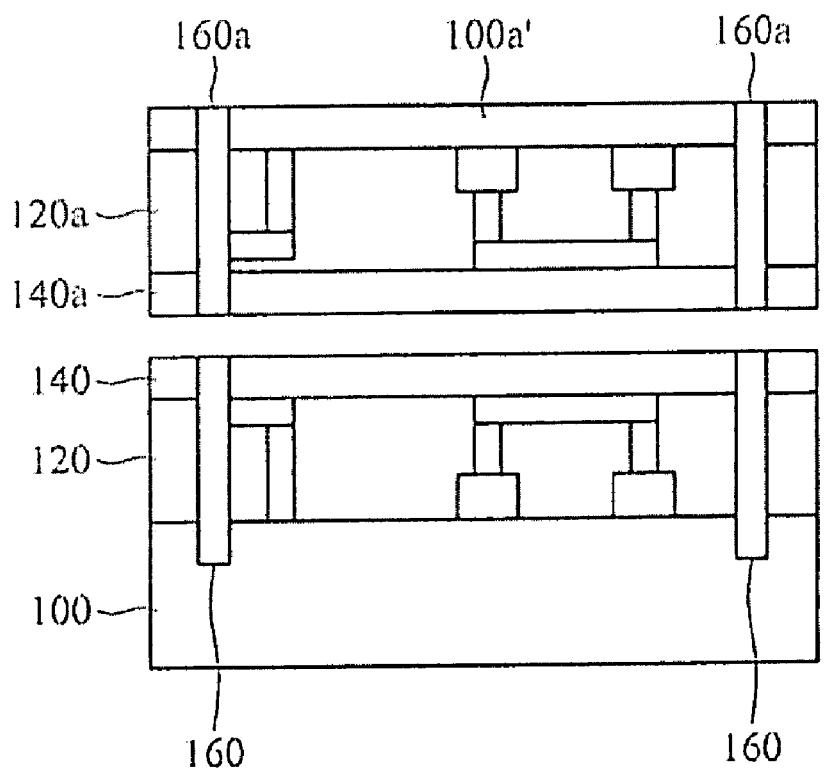

At FIG. 2F, the second device is flipped upside down so that its top surface, i.e., dielectric layer 140a, faces the top surface, i.e., dielectric layer 140, of the first device. The exposed interconnects 160a are aligned with the exposed interconnects 160. The substrate 100a' faces upwards. As described above, the two devices are then bonded together (as shown in FIG. 2G) to have metal-to-metal bond(s) and a non-metal-to-non-metal bond.

Figure 2G:
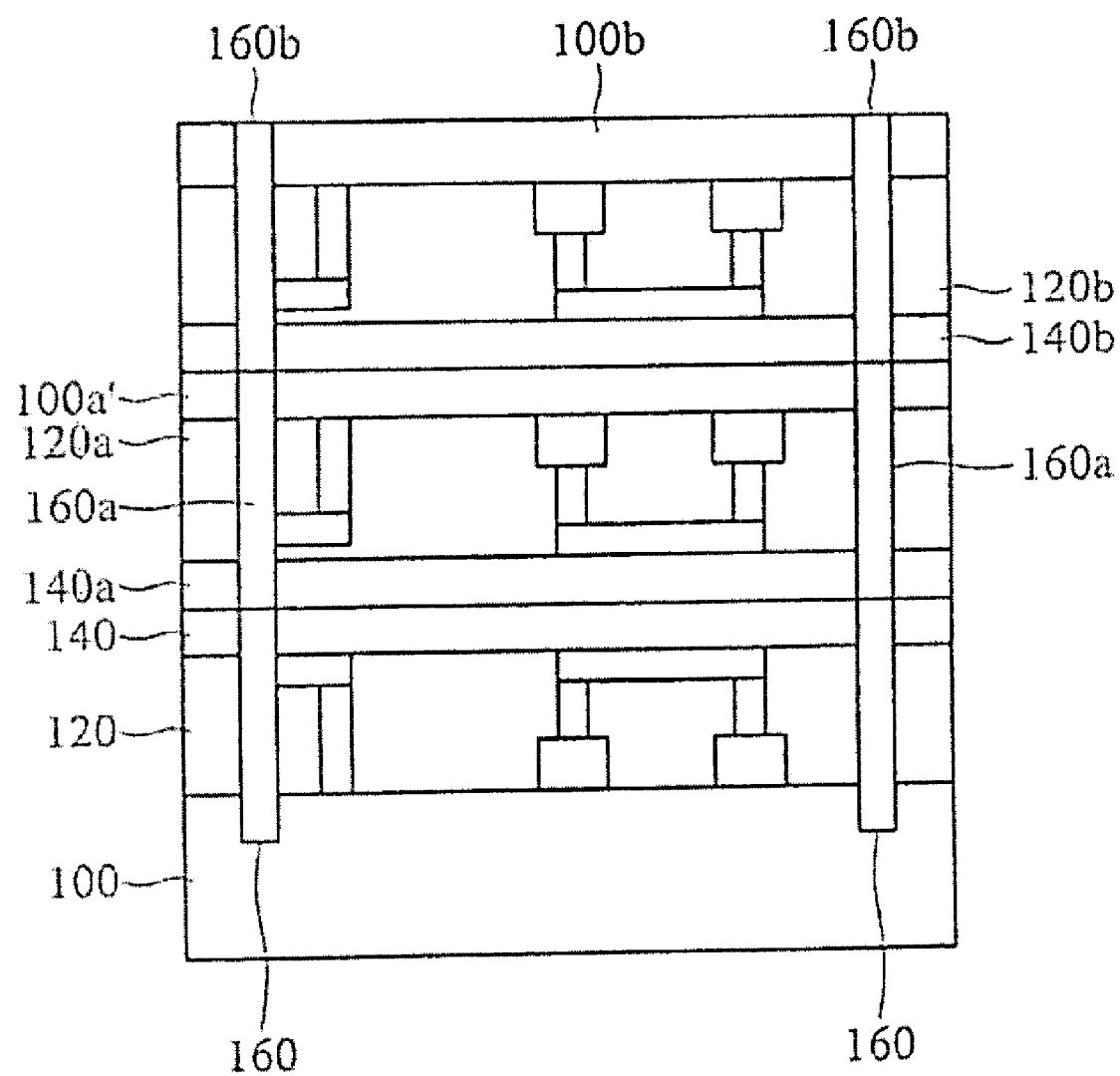
Figure 2H:
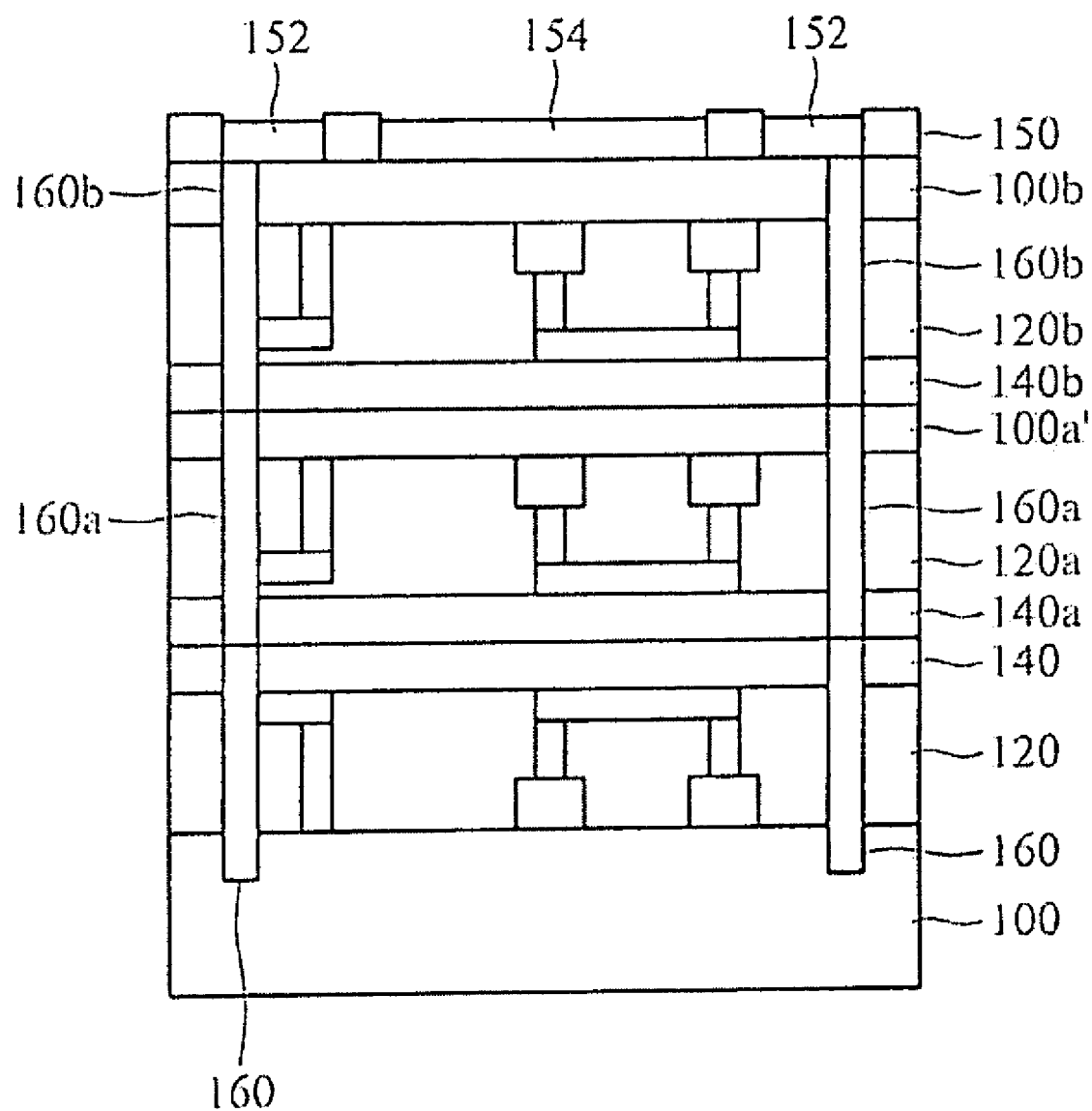
Figure 3A:
FIGS. 3A-3H illustrate yet another alternative method of forming a three dimensional integrated circuit.
Figure 3B:
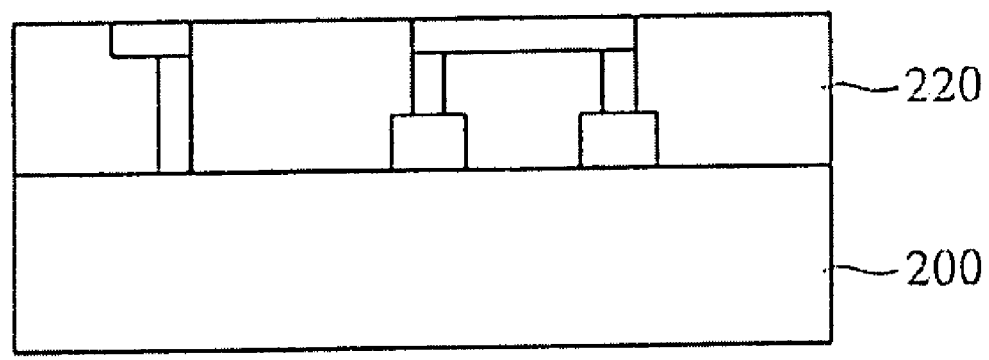
Figure 3C:
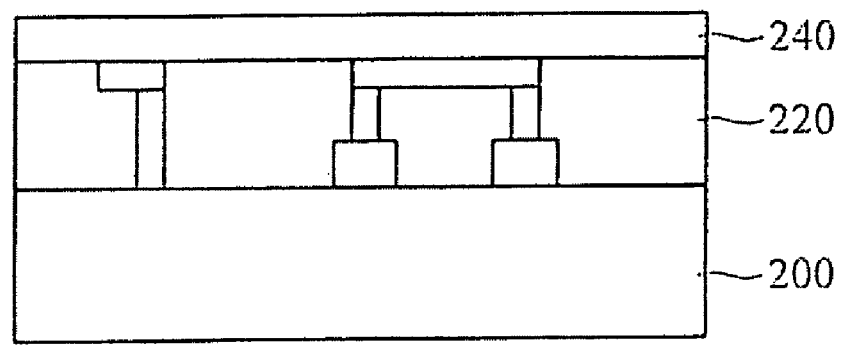
Figure 3D:
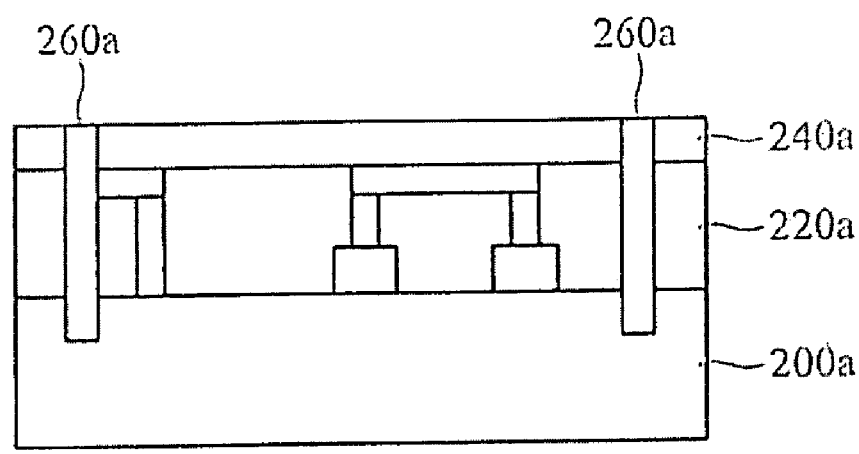
Figure 3D:
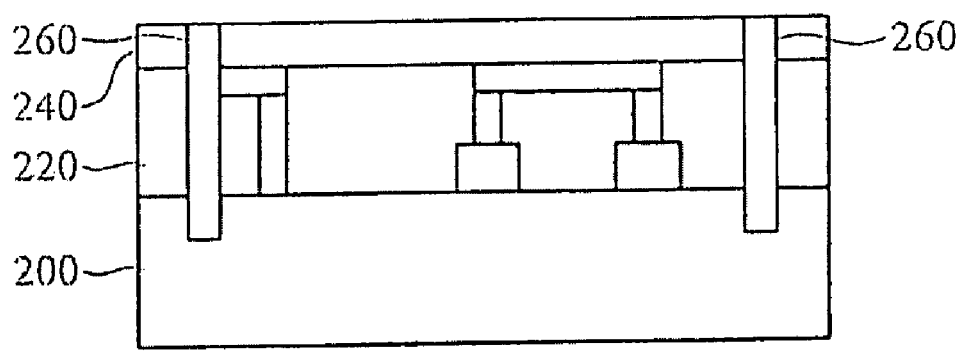
Figure 3E:
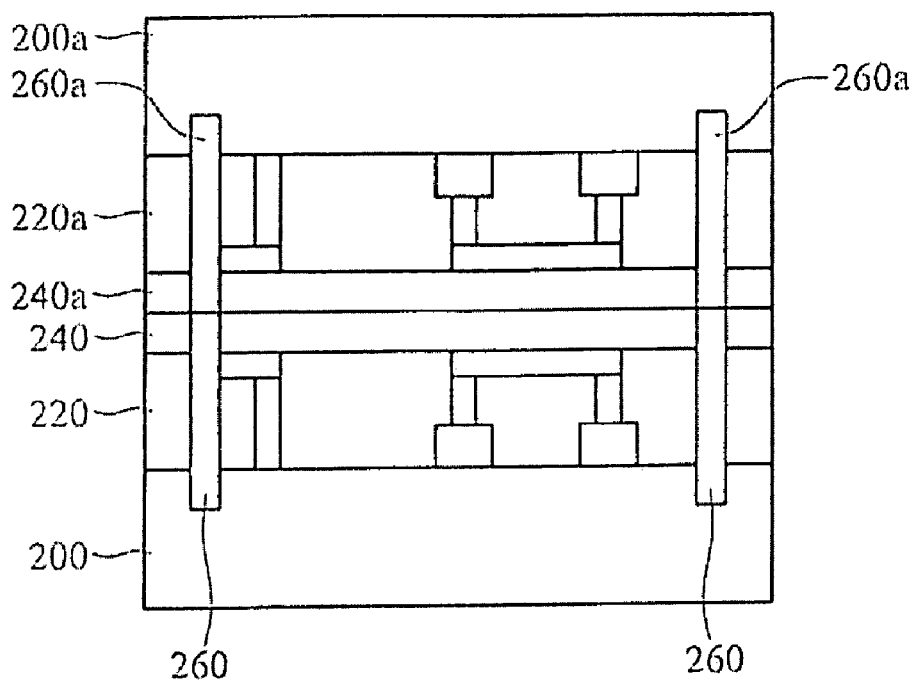
Figure 3F:
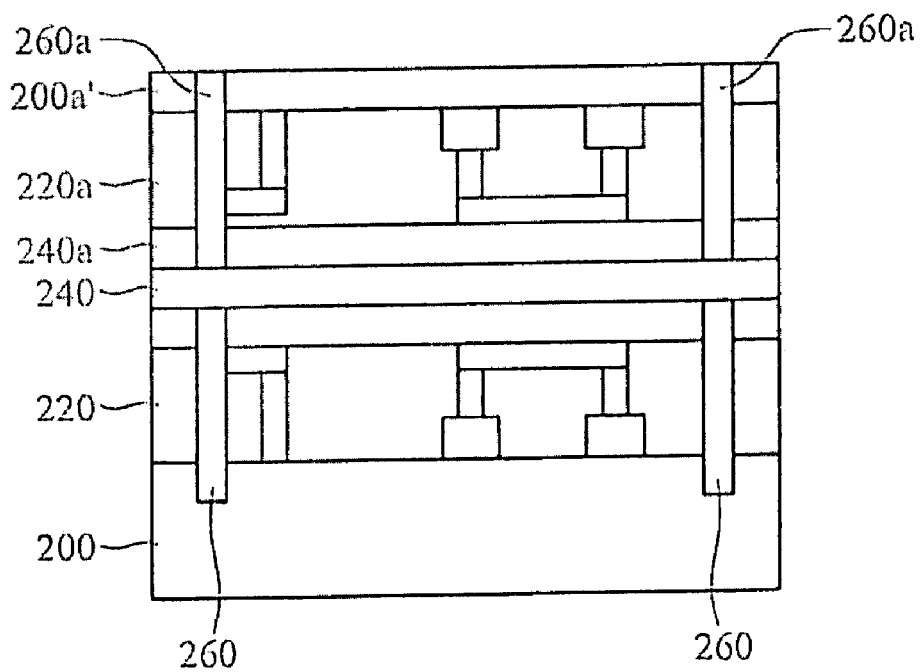
Figure 3G:
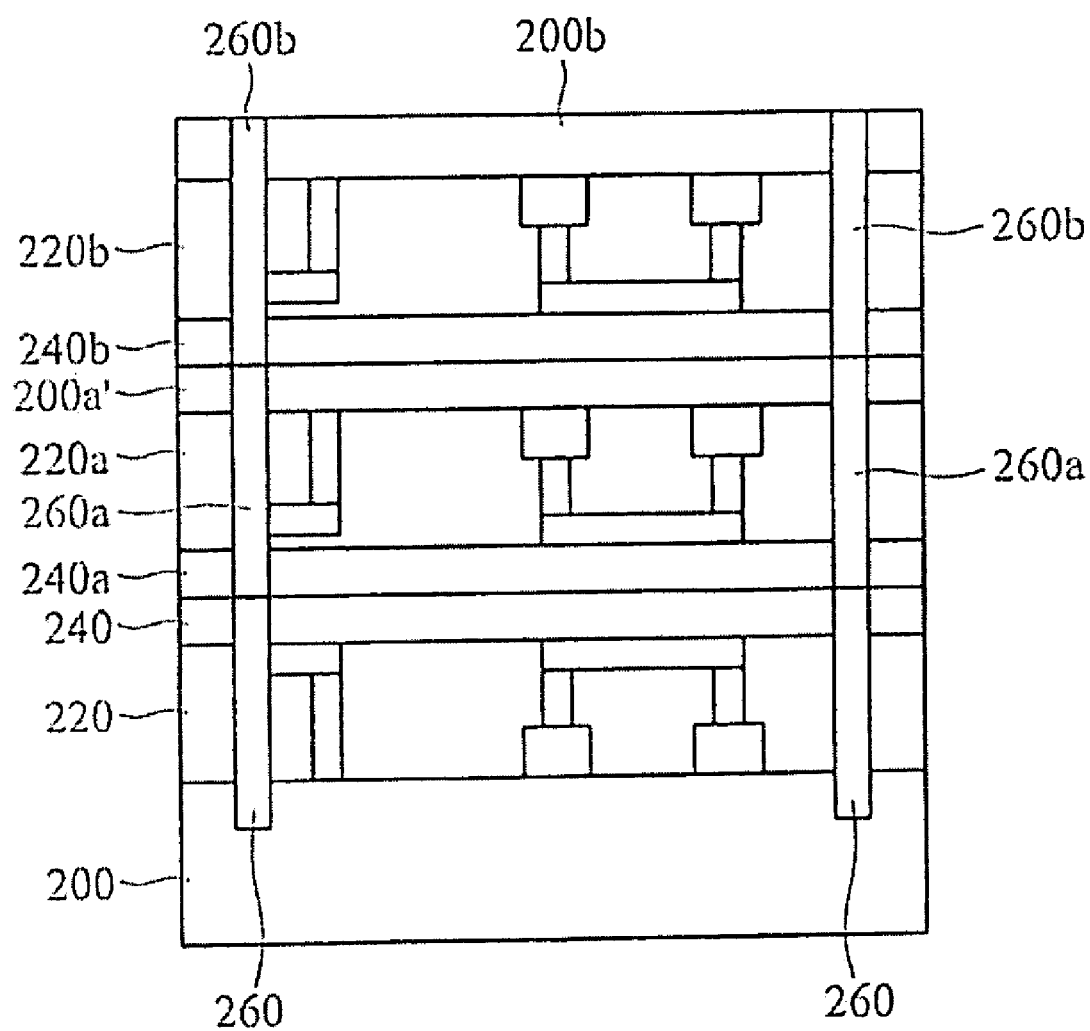
Figure 3H:
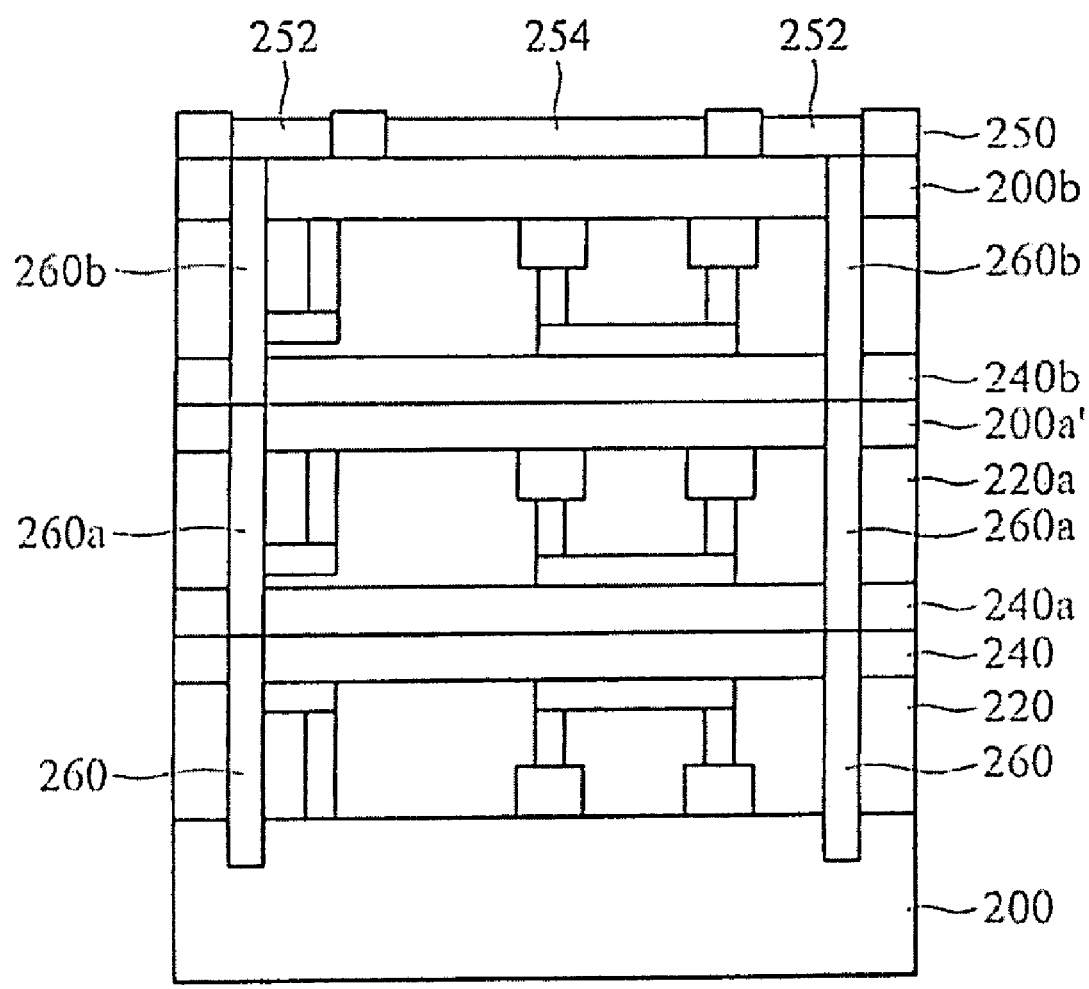

FIGS. 2G and 2H of the method of FIG. 2 are essentially the same as those illustrated in FIGS. 2G and 2H of the method of FIG. 1. A third device having thinned substrate 100b, device layer 120b, dielectric layer 140b and interconnects 160b is formed and aligned over the first and second devices, with the back surface of its substrate 100b facing upwards for formation of bonding structure 150, including passivation layer 154 and bond pads 152, thereon. As compared to the method of FIG. 1, the dielectric layer 140b of the third device contacts and forms a bonding interface with the substrate 100a of the second device, with interconnects 160b and 160a aligning. The second device and third device are bonded together to have a metal-to-metal bond and a non-metal-to-non-metal bond as described above.

FIG. 3 illustrates another alternative embodiment of a method of forming a three-dimensional integrated circuit. The steps of FIGS. 3A-3D are identical to those illustrated by FIGS. 2A-2D of FIG. 2 used in the formation of a first device, which has a substrate 200, device layer 220, dielectric layer 240 and interconnects 260, and in the formation of a second device, which has a substrate 200a, device layer 220a, dielectric layer 240a and interconnects 260a. At FIG. 3E, however, the first and second devices are aligned and bonded together, as described above, before substrate 200a is thinned, as shown in FIG. 3F. In other words, substrate 200a is thinned to expose the interconnects 260a after the first device is bonded to the second device. In this method, the second device is tested after wafer thinning (at FIG. 3F) and thus after wafer bonding (FIG. 3E). The steps of FIGS. 3G and 3H are identical to the steps of FIGS. 2G and 2H. A third device is formed having a substrate 200b, a device layer 220b, a dielectric layer 240b and interconnects 260b. The interconnects 260b are aligned with the interconnects 260a and the third device is bonded to the second device as described above. A bonding structure 250, including passivation layer 254 and bond pads 252 formed therein, is then formed on the backside surface of the thinned substrate 200b.

As can be seen from the foregoing, an improved three-dimensional integrated circuit is provided, where the bond between device pairs comprises a robust hybrid bond comprising metal-to-metal bond(s) and non-metal-to-non-metal bond(s). The bonding strength between stacked device pairs is improved as all or substantially all of the interface between the surfaces of the devices is utilized in the bond. By thinning wafers prior to bonding, individual wafers can be checked for correct functionality. The final device is aligned upside down to provide a robust surface for wire bonding or flip chip bonding.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention

What is claimed is:

1. A three dimensional integrated circuit structure, comprising:
    at least first and second integrated circuit devices, each device comprising a substrate having an integrated circuit layer formed thereon, said first and second devices being bonded together in a stack,
    wherein each device includes at least one metal interconnect formed through at least a portion of its substrate and integrated circuit layer,
    wherein the bond between the first and second integrated circuit devices comprises a metal-to-metal melt bond between said metal interconnects and a non-metal-to-non-metal bond along an interface between adjacent surfaces of the devices.

2. The circuit structure of claim 1, wherein the non-metal-to-non-metal bond comprises at least one of a dielectric fusion bond between the devices and an adhesive bond between the devices.

3. The circuit structure of claim 1, wherein said first and second devices are aligned in a face-to-face orientation.

4. The circuit structure of claim 1, wherein said second and first devices are aligned in a back-to-face orientation, respectively.

5. The circuit structure of claim 1, wherein said first integrated circuit device further comprises a dielectric layer formed over its integrated circuit layer and forming a part of said non-metal-to-non-metal bond.

6. The circuit structure of claim 5, wherein said dielectric layer comprises Si, SiNx, SiOx, SiOxNy, SiC or a polymer.

7. The circuit structure of claim 5,
    wherein said second and first devices are aligned in a back-to-face orientation, respectively,
    wherein the at least one metal interconnect of the first device is further formed through said dielectric layer,
    wherein said metal interconnects of said first and second devices are aligned to form said metal-to-metal melt bond, and
    wherein said substrate of said second device and said dielectric layer of said first device are bonded together along the interface therebetween to form at least a part of said non-metal-to-non-metal bond.

8. The circuit structure of claim 7,
    wherein the second integrated circuit device comprises a dielectric layer formed over a bottom surface of its substrate,
    wherein said at least one metal interconnect of said second device extends through said dielectric layer, and
    wherein said dielectric layer of said second device and said dielectric layer of said first device are directly bonded together to form at least a part of said non-metal-to-non-metal bond.

9. The circuit structure of claim 5,
    wherein the second and first devices are aligned in a face-to-face orientation,
    wherein the at least one metal interconnect of the first device is further formed through said dielectric layer,
    wherein said second device comprises at least one dielectric layer formed over said integrated circuit layer of said second device,
    wherein the at least one metal interconnect of the first device is further formed through said dielectric layer,
    wherein said metal interconnects of said first and second devices are aligned to form said metal-to-metal melt bond, and
    wherein said dielectric layer of said second device and said dielectric layer of said first device are directly bonded together along the interface therebetween to form at least a part of said non-metal-to-non-metal bond.

10. The circuit structure of claim 1, wherein the substrate of said second device is thinner than the substrate of said first device.

11. The circuit structure of claim 1, wherein said stack comprises a plurality of devices, a top most one of said devices being oriented with a bottom surface of said substrate facing upwards and an integrated circuit layer of said device facing the other device or devices in said stack, said integrated circuit structure further comprising a passivation and bonding structure formed over said bottom surface of said substrate.

12. A method of forming a three dimensional integrated circuit structure, comprising the following steps:
providing at least first and second integrated circuit devices, each device comprising a substrate having an integrated circuit layer formed thereon and at least one metal interconnect formed through at least a portion of its substrate and integrated circuit layer; and
bonding said first and second devices together in a stack, wherein the bond between the first and second devices comprises a metal-to-metal melt bond between said metal interconnects and a non-metal-to-non-metal bond along an interface between adjacent surfaces of the devices.

13. The method of claim 12, wherein the bonding step comprises the following steps:
forming a dielectric layer over the integrated circuit layer of the first device;
forming the at least one metal interconnect of the first device through said dielectric layer;
aligning said metal interconnects of said first and second devices,
wherein said substrate of said second device and said dielectric layer of said first device are bonded together along the interface therebetween to form at least a part of said non-metal-to-non-metal bond.

14. The method of claim 12, wherein the bonding step comprises the following steps:
forming a dielectric layer over the integrated circuit layer of the first device;
forming the at least one metal interconnect of the first device through said dielectric layer;
forming a dielectric layer over the integrated circuit layer of the second device;
forming the at least one metal interconnect of the second device through the dielectric layer of said second device;
aligning said metal interconnects of said first and second devices,
wherein said dielectric layer of said second device and said dielectric layer of said first device are directly bonded together along the interface therebetween to form at least a part of said non-metal-to-non-metal bond.

15. The method of claim 12, further comprising providing at least one additional device to said stack, wherein a topmost one of said at least one additional device is aligned with a top surface thereof facing said first device, said method further comprising the steps of:
forming a dielectric layer over the integrated circuit layer of the at least one additional device;
forming at least one metal interconnect through the dielectric layer, said integrated circuit layer and substrate of said at least one additional device;
aligning said at least one metal interconnect of said at least one additional device with a metal interconnect of another device in the stack,
wherein said metal interconnects of said devices are bonded together to form a metal-to-metal melt bond between said at least one additional device and said another device, and
wherein said dielectric layer of said at least one additional device forms a part of a non-metal-to-non-metal bond with said another device along an interface therebetween.

16. The method of claim 12, wherein said metal-to-metal bond comprises a bond between an exposed copper portion from said first device and an exposed copper portion from said second device, said method further comprising the step of forming said exposed copper portions using a copper damascene method.

17. The method of claim 12, wherein said metal-to-metal bond is formed between exposed metal interconnects formed in said first and second devices, the method further comprising the step of forming an exposed metal interconnect in said second device by the steps comprising:
etching an interconnect via through said integrated circuit layer of said second device and partially through said substrate of said second device;
filling said interconnect via with a metal material; and
thinning said substrate to expose said metal material.

18. The method of claim 12, wherein the non-metal-to-non-metal bond comprises at least one of a dielectric fusion bond between the devices and an adhesive bond between the devices.

19. The method of claim 12, further comprising the step of forming a dielectric layer over said integrated circuit layer of said first device, said dielectric layer forming a part of said non-metal-to-non-metal bond.

20. A three dimensional integrated circuit structure, comprising:
at least first and second integrated circuit dies, each die comprising a substrate having an integrated circuit formed thereon, said first and second dies being bonded together along an interface between adjacent surfaces thereof to form a stack,
each die comprising at least one metal interconnect formed at least partially through the die,
wherein the at least one metal interconnect of at least one of said dies is exposed through said substrate of said at least one die,
wherein the bond between the first and second dies comprises a metal-to-metal melt bond between said interconnects and a non-metal-to-non-metal bond along said interface, whereby substantially the entire interface between said first and second devices is bonded.

21. The integrated circuit structure of claim 20, wherein the non-metal-to-non-metal bond along said interface is a direct oxide fusion bond between surfaces of said dies.

22. The integrated circuit structure of claim 20, wherein the non-metal-to-non-metal bond along said interface is an adhesive bond between surfaces of said dies.

* * * * *